United States Patent
Hof et al.

(10) Patent No.: US 7,130,017 B2
(45) Date of Patent: Oct. 31, 2006

(54) DEVICE FOR SEALING A PROJECTION EXPOSURE APPARATUS

(75) Inventors: Albrecht Hof, Aalen (DE); Guenter Maul, Aalen (DE); Lothar Gail, Wiesbaden (DE); Wilfried Schierholz, Hochheim (DE); Eberhard Jost, Hattersheim (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 11/067,315

(22) Filed: Feb. 25, 2005

(65) Prior Publication Data
US 2005/0206860 A1    Sep. 22, 2005

Related U.S. Application Data

(63) Continuation of application No. PCT/EP03/09427, filed on Aug. 26, 2003.

(30) Foreign Application Priority Data
Aug. 28, 2002 (DE) ............................ 102 39 344

(51) Int. Cl.
*G03B 27/52* (2006.01)
*G03B 27/42* (2006.01)
(52) U.S. Cl. ..................................... 355/30; 355/53
(58) Field of Classification Search ............... 359/228, 359/573, 886, 489, 507; 355/30, 67, 53
See application file for complete search history.

(56) References Cited

U.S. PATENT DOCUMENTS

| | | | |
|---|---|---|---|
| 5,305,364 A | 4/1994 | Mochiji et al. | |
| 5,638,223 A | 6/1997 | Ikeda | |
| 5,973,764 A | 10/1999 | McCullough et al. | |
| 6,252,712 B1 | 6/2001 | Furter et al. | |
| 2001/0038442 A1 | 11/2001 | Hansell et al. | |
| 2002/0159042 A1* | 10/2002 | Poon | 355/53 |
| 2002/0191163 A1 | 12/2002 | Hasegawa et al. | |
| 2003/0006380 A1* | 1/2003 | Van Empel et al. | 250/492.3 |
| 2004/0008328 A1* | 1/2004 | Akagawa et al. | 355/30 |
| 2004/0257544 A1* | 12/2004 | Vogel et al. | 355/30 |
| 2005/0146696 A1* | 7/2005 | Arakawa | 355/30 |

* cited by examiner

*Primary Examiner*—Rodney Fuller
*Assistant Examiner*—Kevin Gutierrez
(74) *Attorney, Agent, or Firm*—Darby & Darby

(57) ABSTRACT

A projection exposure apparatus is equipped with an illumination system, a reticle, a projection objective and an image plane. Interstitial spaces between the individual elements of the apparatus are open to the ambient space. A gas purge device which carries a stream of noble gas or nitrogen is arranged in at least one of the interstitial spaces. The gas purge device is of a shape and size so that one or more interstitial spaces are at least to a large extent sealed off from the ambient space surrounding the projection apparatus.

26 Claims, 4 Drawing Sheets

DEVICE FOR SEALING A PROJECTION EXPOSURE APPARATUS

CROSS-REFERENCE TO RELATED APPLICATION

This application is a continuation of International Patent Application Serial No. PCT/EP2003/009427, filed Aug. 26, 2003, which published in German on Mar. 25, 2004 as WO 2004/025368, and is incorporated herein by reference in its entirety.

TECHNICAL FIELD

The invention relates to a device for sealing a projection exposure apparatus with an illumination system, a reticle, a projection objective and an image plane, where the interstitial spaces between the individual elements of the apparatus are open to the ambient space.

BACKGROUND

A device of this type has been disclosed in EP 0 886 184, wherein a vacuum-operated device is described which is arranged between a wafer and an optical element. The device has an illumination field opening at its center, leaving a minimal upper gap to a lens surface and a further minimal gap to a wafer surface. The gas flow is introduced above and below the device and exits again within the device through slot-shaped openings. As a result, contaminations, specifically dust grains, are removed from the lens surface.

The task that has been set for the present invention is to provide a device which can be arranged in the critical areas of the projection apparatus but dues not absorb a large portion of, nor interfere with, the radiation that is present in those areas.

SUMMARY

According to the invention, the task is solved by arranging in at least one of the interstitial spaces a gas purge device carrying a stream of nitrogen or inert gas, where the gas purge device is of a shape and size so that one or more of the interstitial spaces are to a large extent sealed off from the ambient space surrounding the projection apparatus.

In a first inventive solution of the task, the space between a projection objective and an image plane is sealed off to a high degree by an appropriately dimensioned device to form a so-called containment, where the sealing effect occurs without contact. In lithography processes at a wavelength of 157 nm, the radiation would be absorbed to a large extent in an air-filled space between the projection objective and the image plane, and it is therefore necessary to provide a protective gas atmosphere using nitrogen or a noble gas. These gases have a low degree of absorption for the type of radiation used in this application. Using pure nitrogen for the protective gas ensures that a substrate coated with photosensitive materials receives the 157 nm-wavelength radiation without loss and that the last surface of the projection objective remains free of harmful substances.

In an advantageously developed embodiment of the invention, the gas-flow device is equipped with at least one gas-inflow device and at least one gas-outflow device, where the cross-sectional area of the inflow stream of nitrogen or noble gas can be larger than the cross-sectional area of the outflow stream. The at least one gas-inflow device can be configured as a hollow orifice channel, and the gas outflow device can be configured in the form of seal gaps.

The not completely seal-tight containments are constantly replenished with gas through the hollow orifice passages, while the gas flows out again through the seal gaps. The gaps have to have a large enough overlap and be dimensioned commensurately with the magnitude of the inflowing gas stream, so that no extraneous gas can enter by diffusion and no streams can flow in the reverse direction through the gaps. It is advantageous if the interior space of the gas purge device is under a slight overpressure.

The inlet orifice channels used in the purge device should fill the space in the containment as uniformly as possible and without turbulence. The throttle effect of the purge device should not occur in the inlet orifice passage. Rather, it is advantageous if the gas leaves the inlet orifice passage as a laminar stream. The sealing effect against the ambient space occurs as a result of the gas outflow being channeled through a sufficiently long gap passage.

According to a second solution in accordance with the invention, a gas purge device can also be arranged in the space between the illumination and the reticle. The seal gaps for the outflowing gas are in this case formed by a stack of lamellar disks with ring gaps, in an arrangement where the lamellae can slide relative to each other.

The stack of lamellae is likewise designed as a seal against the ambient space. The gas streams into the device through the inlet orifice passages and streams out through the lamellae that form the seal gaps. This arrangement has the advantage that the space to the side of the light path remains largely free of installed elements so that it can be used for the positioning of the stage with the space remaining sealed when the reticle is moved in relation to the rest of the apparatus.

In a further embodiment of the invention, an arrangement of two large ring-shaped plates that are laterally movable relative to each other may be used for the seal, wherein one plate is fixedly connected to the projection objective and the other plate is fixedly connected to the gas purge device.

Only a very limited amount of clear space is available for the sealing arrangement between the reticle and the projection objective. It is therefore advantageous if the two plates are of a sufficient length so that when the reticle is shifted to different positions, the two plates still overlap each other to keep the gas-purged space sealed off.

Other features and advantages of the present invention will be apparent from the following detailed description when read in conjunction with the accompanying drawings.

BRIEF DESCRIPTION OF THE DRAWINGS FIGURES

The foregoing and other features of the present invention will be more readily apparent from the following detailed description and drawings figures of illustrative embodiments of the invention in which.

DETAILED DESCRIPTION OF PREFERRED EMBODIMENTS

Figure 1:
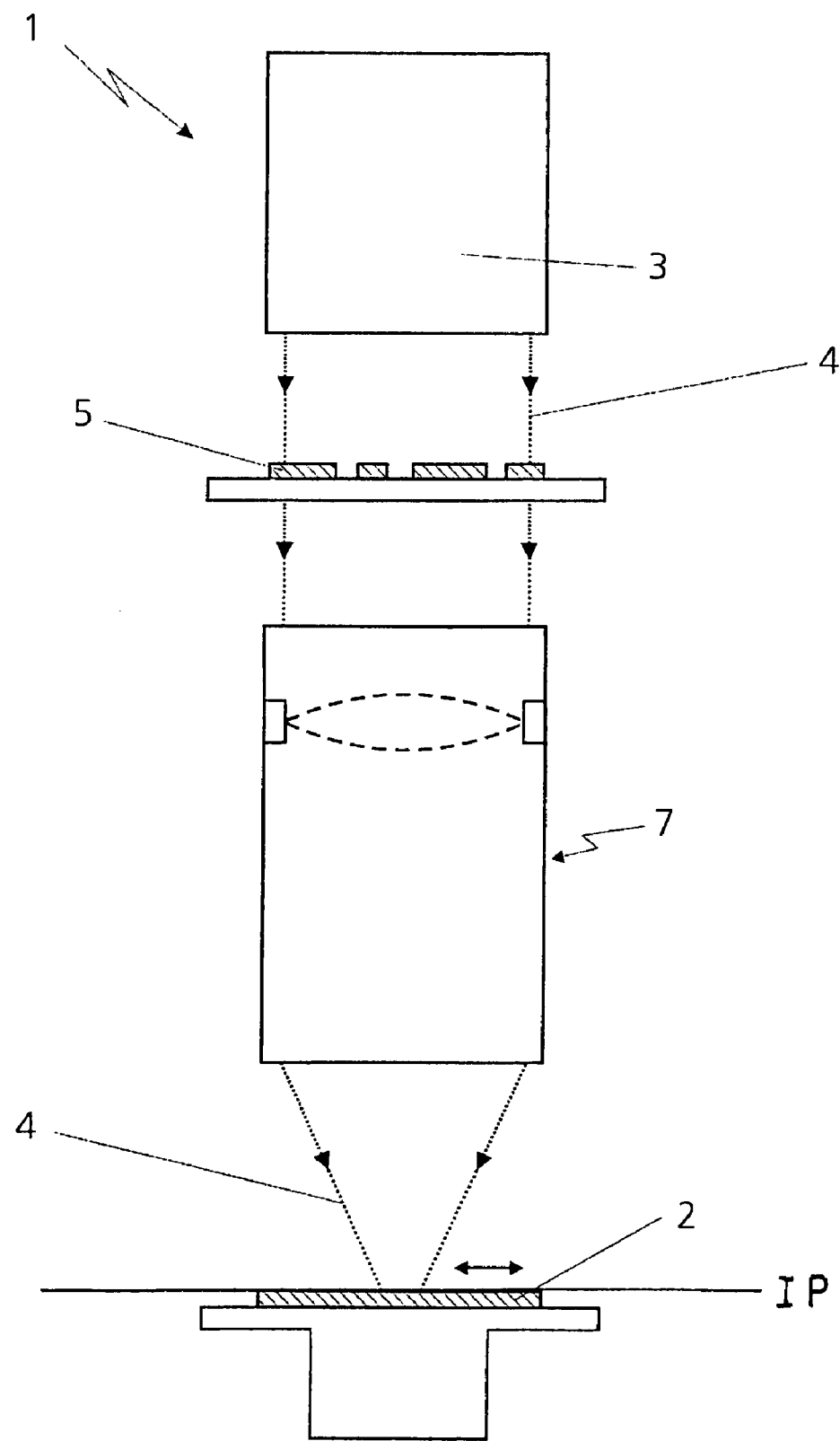
FIG. 1 represents a principal outline of a projection apparatus for the field of microlithography, which finds application for projecting circuit structures onto wafers that are coated with photosensitive materials.

FIG. 1 illustrates a projection apparatus 1 of a type that is known in principle from U.S. Pat. No. 5,638,223 and U.S. Pat. No. 6,252,712 whose entire content is incorporated herein by reference. Therefore, the functional principle of an apparatus of this type is assumed to be known and the following detailed description will be limited to those parts that are relevant to the invention.

Systems of this type are used for the production of semiconductor components and serve to project circuit structures onto a substrate that is coated with photosensitive materials, consists in general predominantly of silicon, and is referred to as a wafer 2.

The projection apparatus 1 consists substantially of an illumination device 3, a so-called reticle 5 which defines the structures that will subsequently reside on the wafer, and an imaging system in the form of a projection objective 7.

According to the basics of the functional principle, the structures incorporated in the reticle 5 are projected onto the wafer 2 in a reduced size.

After an exposure has been completed, the wafer 2 is moved in the x- and y-directions by means of positioning stages 26 which are fixedly connected to the overall apparatus 27, so that a multitude of individual fields can be exposed to the structure defined by the reticle 5. A translatory movement 25 of the wafer in the z-direction is likewise available.

The illumination device 3 provides a projection light beam 4 as required to form an image of the reticle 5 on the wafer 2. The light beam is shaped in the illumination device 3 by means of optical elements in such a way that when the projection light beam 4 falls on the reticle 5, it has the specified properties in regard to diameter, polarization, shape of the wave front, and other characteristics.

An image of the reticle 5 is produced with the light beam 4 and transferred in a reduced size through the projection objective 7 to the wafer 2.

Figure 2:
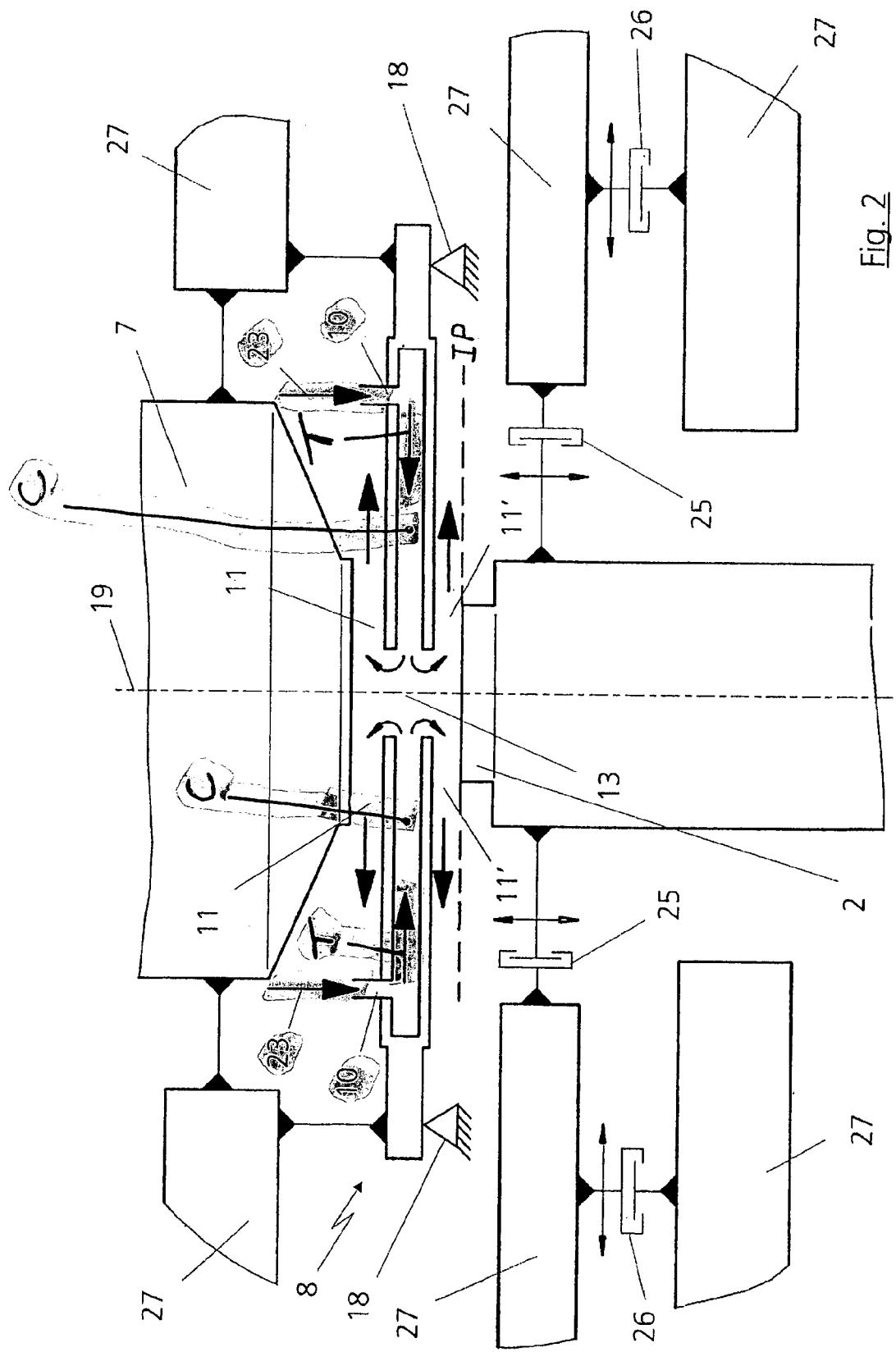
FIG. 2 represents a lengthwise sectional view of a gas purge device which is arranged between a projection objective and a wafer.

FIG. 2 illustrates a principal configuration of a gas purge device 8. In a preferred arrangement, a ring-shaped inlet orifice channel 10 in the space between the projection objective 7 and the wafer 2 provides a laminar inflow of the gas 23 into the cylindrical gas purge device 8. The orifice passage 10 can also be divided into segments along the circumference, so that the inflow of gas can be controlled more precisely. The purging occurs in the purge area 13. As the radiation passing through the purge area 13 needs to have a high energy level, the purging with nitrogen or with an noble gas 23, helium in particular, serves to prevent the presence of certain radiation-absorbing gases, especially air, in the beam passage area 13.

There are two gaps located, respectively, at the top and bottom of the gas purge device 8, i.e., the gap 11 between the projection objective and the gas purge device, and the gap 11' between the gas purge device and the waver. The gaps 11 and 11' should be less than one millimeter wide. The pure nitrogen or noble gas 23 which is blown into the purge device streams out through the gaps 11 and 11' into the ambient space or into exhaust gas devices which may be part of the setup but are not shown in the drawing.

The passages through the gaps 11 and 11' need to be long enough that no extraneous or ambient gas can enter into the device by diffusion.

The volume of gas 23 flowing in through the orifice passages 10 needs to be larger than the volume flowing out through the gaps 11 and 11'. Thus, the cross-sectional area of the inflow passage can be slightly larger than the cross-sectional area of the outflow passage in order to achieve a desired ratio between the respective flow rates. As a result, there is a slight overpressure inside the gas purge device 8.

The tendency for a pocket of stagnant gas to form at the center of the ring-shaped orifice 10 on the optical and mechanical centerline axis 19 is prevented by slight asymmetries which are always present. For example, the gaps 11 and 11' usually have different widths. It is also possible that one of the gaps, preferably the upper gap 11, is reduced to zero. In this case, the orifice channel 10 is in direct, seal-tight contact with the projection objective 7 without leaving a microscopic gap, so that there is only the one gap 11'.

The gas purge device 8 is equipped with support bearings 18. The bearings 18 are located on a bearing mount of a mechanism 27 which is not illustrated in detail. The wafer 2 is likewise supported by the bearing mount 27. The bearings 18 are needed so that when the wafer 2 is moved the gas purge device 8 can stay in place.

Figure 3:
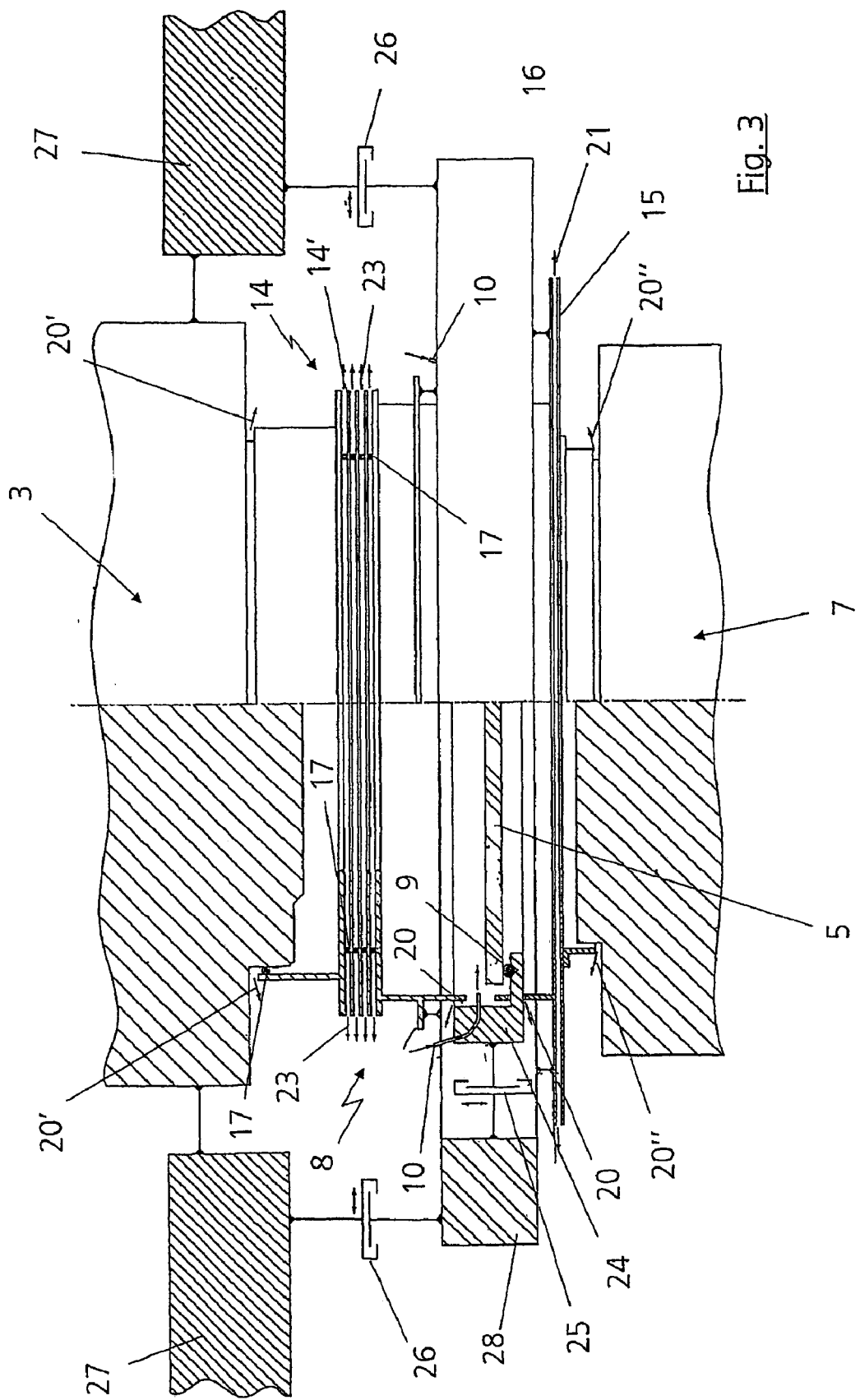
FIG. 3 represents a lengthwise sectional view of a gas purge device which is arranged between an illumination device, a reticle and a projection objective.

FIG. 3 shows a gas purge device 8' enclosing the reticle 5. As in the arrangement of FIG. 2, the gas inflow occurs again through ring-shaped orifice passages 10. The gas 23 streams through the orifice passages 10 into the interstitial space between the reticle 5 and the illumination device 3 as well as into the interstitial space between the reticle 5 and the projection objective 7. A stack of lamellar disks 14 is arranged on the topside of the gas purge device 8'. The gas 23 flows out through the lamellae each of which forms a seal gap. The stack of lamellar disks 14 consists of a plurality of lamellae 14' arranged on top of each other and configured as flat ring disks leaving an opening in the center so as to allow the radiation to fall on the reticle 5. The lamellae 14' are made of metallic materials that will hold up under the radiation. The lamellae 14' are held at a constant gap distance by balls and magnets 17 which cooperate with soft iron inserts. The gas 23 in the gas purge device 8 can stream out through the stack 14 of lamellae, in particular through the gaps between the lamellae 14' and through the gaps 20'.

The gas 23 streams inside the gas purge device 8' from the space above the reticle 5 to the space below the reticle 5. The latter is seated at its outer ends through a three-point support 9 on an interior frame 24. The gas purge device 8' is closed off at the bottom by a closure plate 16. To provide a sufficiently wide gap 21 between the gas purge device 8' and the projection objective 7, an upper closure plate 15 of the projection objective 7 is fixedly attached to the latter. This arrangement is chosen because only a very limited clearance height is available in this area.

The plates 15 and 16 are of ring-shaped configuration leaving sufficiently large openings through the middle of the plates 15 and 16 for the light beam to pass through, taking into account that the plates 15 and 16 can slide laterally in relation to each other. When the reticle 5 is pulled out to its extreme position relative to the overall apparatus, there still needs to be a sufficiently large overlap between the two plates 15 and 16, i.e. half of the nominal gap passage length, so that no extraneous gas can ever enter and contaminate the purge area.

The interior frame 24 on which the reticle 5 is supported is movable on sliding stages 25 in the z-direction relative to the gas purge device 8', the stack 14 of lamellar disks, and the outer frame 28. The arrangement is designed so that illumination is maintained when the interior frame 24 with the reticle 5 is moved to different positions. In order to ensure the effectiveness of the seal in every position, the ring gaps 20 which can have different diameters should always have a specific ratio between width and passage length. The length of the gap passage to the width of the gap should always be in a ratio of 10 mm to 20 mm length vs. 0.5 mm to 10 mm width. The gas purge device 8' also has ring-shaped openings not shown in detail. By way of the gaps 20, the ring-shaped openings and the stack 14 of laminar disks, the gas 23 inside the purge device 8' can flow out again.

The foregoing arrangement has the advantage that the space to the side of the light path remains largely free of installed elements so that it can be used for the measuring arrangement used in the positioning of the stage.

Figure 4:
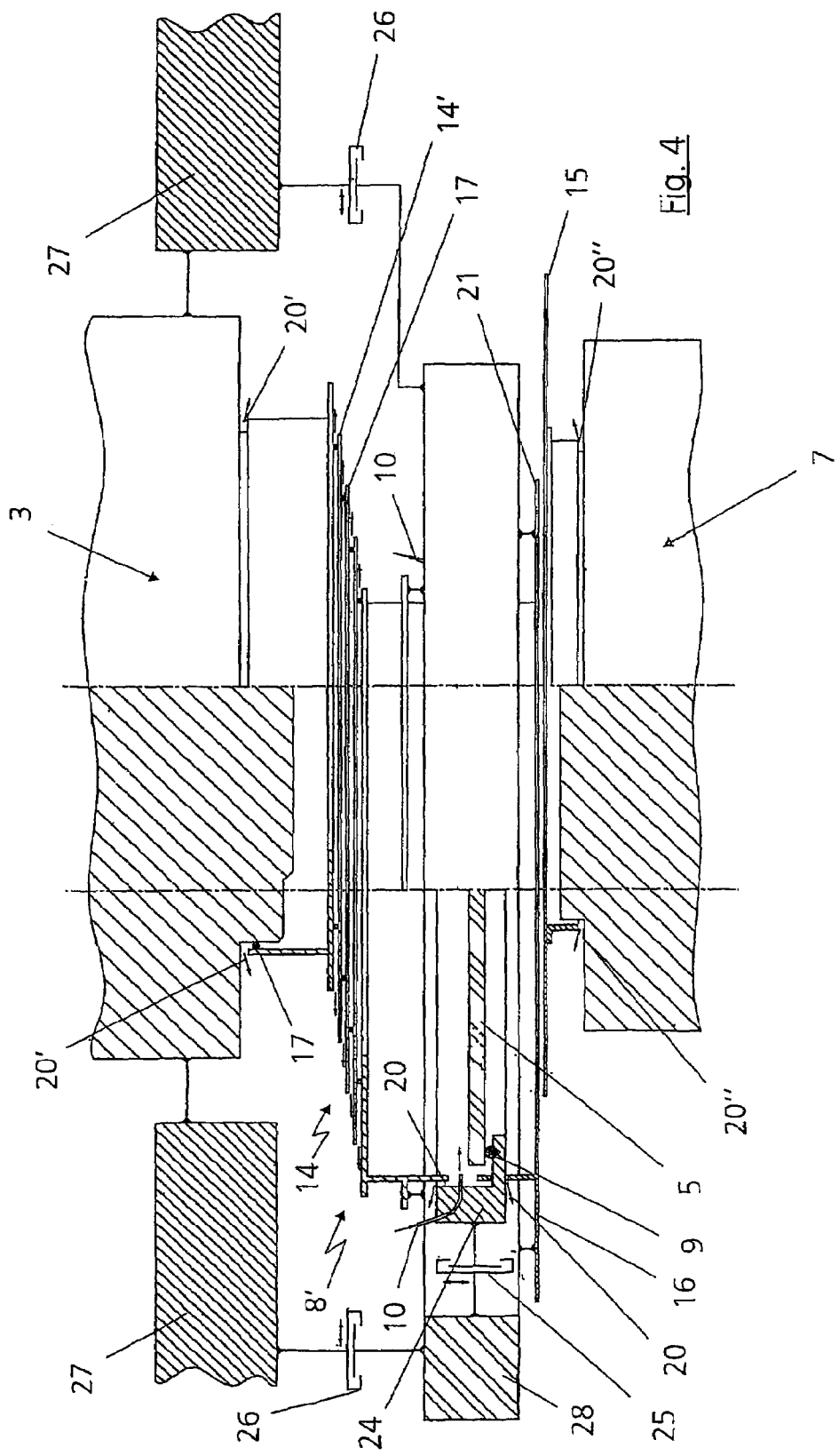
FIG. 4 represents the apparatus shown in FIG. 3, wherein the reticle has been moved sideways in relation to the illumination system and the projection objective.

FIG. 4 shows the gas purge device 8' moved sideways. As the reticle 5 is moved on sliding stages 26 in the x- and y-directions in relation to the illumination system 3 and the projection objective 7, the stack 14 of laminar disks shifts to a staggered position of the disks. The inflow of gas occurs likewise by way of the ring-shaped hollow orifice channel 10. The nitrogen or the inert gas 23 streams out through the seal gaps between the lamellar disks 14' and through the gaps 20, 20', 20", 21 and can also be carried away from these locations by an exhaust gas device which is not shown in the drawing.

A sideways shifting movement of the reticle 5 is required in order to sequentially expose a multitude of individual fields on the wafer 2 to the projection of the structure defined by the reticle 5.

The removal of gases that would interfere with the exposure process should occur within a few tenths of a second. The amount of gas need for this purpose should be kept small.

While exemplary drawings and specific embodiments of the present invention have been described and illustrated, it is to be understood that the scope of the present invention is not to be limited to the particular embodiments discussed. Thus, the embodiments shall be regarded as illustrative rather than restrictive, and it should be understood that variations may be made in those embodiments by workers skilled in the art without departing from the scope of the present invention as set forth in the claims that follow, and equivalents thereof. In addition, the features of the different claims set forth below may be combined in various ways in further accordance with the present invention.

The invention claimed is:

1. A projection exposure apparatus, comprising:
an illumination system; a reticle; a projection objective; and an image plane, wherein interstitial spaces between the individual elements of the apparatus are open to ambient space; and
a gas purge device arranged in at least one of the interstitial spaces for carrying a stream of one of a noble gas and nitrogen, wherein the gas purge device is of a shape and size so that one or more interstitial spaces are at least to a large extent sealed off from the ambient space surrounding the projection exposure apparatus, wherein the gas purge device is equipped with at least one gas inflow device that is configured as a hollow orifice passage and with at least one gas outflow device, wherein the hollow orifice passage is ring-shaped and extends circumferentially about an optical axis of the apparatus so as to achieve a laminar inflow stream of the nitrogen or the noble gas into the gas purge device, wherein the gas purge device includes a compartment extending between the ring-shaped passage to permit the gas to flow in a transverse direction relative to the inflow into the gas purge device.

2. The apparatus according to claim 1, wherein the hollow orifice passage is divided into segments along its circumference.

3. The apparatus according to claim 1, wherein the gas outflow device is equipped with gap seals.

4. The apparatus according to claim 1, wherein the gas purge device is arranged between the image plane and the projection objective.

5. The apparatus according to claim 1, wherein the gas purge device is arranged between the illumination system and the projection objective.

6. The apparatus according to claim 1, wherein an above-ambient pressure is provided inside the gas purge device.

7. The apparatus according to claim 1, wherein the inflow passage for the delivery of the nitrogen or noble gas is designed with a larger cross-sectional area than the outflow passage.

8. The apparatus according to claim 1, wherein the noble gas comprises helium.

9. The apparatus according to claim 1, wherein the gas purge device is configured with a cylindrical shape.

10. A projection exposure apparatus, comprising:
an illumination system; a reticle; a projection objective; and an image plane, wherein interstitial spaces between the individual elements of the apparatus are open to ambient space; and
a gas purge device arranged in at least one of the interstitial spaces for carrying a stream of one of a noble gas and nitrogen, wherein the gas purge device is of a shape and size so that one or more interstitial spaces are at least to a large extent sealed off from the ambient space surrounding the projection exposure apparatus, wherein the gas purge device is equipped with at least one gas inflow device and with at least one gas outflow device that is equipped with lamellar-shaped gap seals, wherein the gap seals are ring shaped.

11. The apparatus according to claim 10, wherein the gas purge device is arranged between the image plane and the projection objective.

12. The apparatus according to claim 10, wherein the gas purge device is arranged between the illumination system and the projection objective.

13. The apparatus according to claim 10, wherein an above-ambient pressure is provided inside the gas purge device.

14. The apparatus according to claim 10, wherein the inflow passage for the delivery of the nitrogen or noble gas is designed with a larger cross-sectional area than the outflow passage.

15. The apparatus according to claim 10, wherein the lamellar-shaped gap seals can be shifted laterally in relation to each other.

16. The apparatus according to claim 10, wherein the noble gas comprises helium.

17. The apparatus according to claim 10, wherein the gas purge device is configured with a cylindrical shape.

18. A projection exposure apparatus, comprising:
an illumination system; a reticle; a projection objective; and an image plane, wherein interstitial spaces between the individual elements of the apparatus are open to ambient space; and
a gas purge device arranged in at least one of the interstitial spaces for carrying a stream of one of a noble gas and nitrogen, wherein the gas purge device is of a shape and size so that one or more interstitial spaces are at least to a large extent sealed off from the ambient space surrounding the projection exposure apparatus, wherein the gas purge device is equipped with at least one gas inflow device and with at least one gas outflow device that is equipped with two ring-shaped plates to provide a seal, wherein the two ring-shaped plates can be shifted (laterally) in relation to each other.

19. The apparatus according to claim 18, wherein the fixed connections are provided for attaching one of the plates to the projection objective, and fixed connections are provided for attaching the other plate to the gas purge device.

20. The apparatus according to claim 18, wherein each of the two plates is provided with a central opening.

21. The apparatus according to claim 18, wherein the gas purge device is arranged between the image plane and the projection objective.

22. The apparatus according to claim 18, wherein the gas purge device is arranged between the illumination system and the projection objective.

23. The apparatus according to claim 18, wherein an above-ambient pressure is provided inside the gas purge device.

24. The apparatus according to claim 18, wherein the inflow passage for the delivery of the nitrogen or noble gas is designed with a larger cross-sectional area than the outflow passage.

25. The apparatus according to claim 18, wherein the noble gas comprises helium.

26. The apparatus according to claim 18, wherein the gas purge device is configured with a cylindrical shape.

* * * * *